United States Patent [19]

Bour et al.

[11] Patent Number: 5,977,612
[45] Date of Patent: Nov. 2, 1999

[54] SEMICONDUCTOR DEVICES CONSTRUCTED FROM CRYSTALLITES

[75] Inventors: David P. Bour, Cupertino; Fernando A. Ponce, Sunnyvale; G. A. Neville Connell; Ross D. Bringans, both of Cupertino; Noble M. Johnson, Menlo Park; Werner K. Goetz, Palo Alto; Linda T. Romano, Sunnyvale, all of Calif.

[73] Assignee: Xerox Corporation, Stamford, Conn.

[21] Appl. No.: 08/770,403

[22] Filed: Dec. 20, 1996

[51] Int. Cl.⁶ ..................................................... H01L 29/06
[52] U.S. Cl. .......................... 257/618; 257/466; 257/103; 257/440
[58] Field of Search ................................... 257/466, 618, 257/94, 97, 103, 440, 499

[56] References Cited

PUBLICATIONS

F. A. Ponce, D. P. Bour, and W. Götz, Palo Alto Research Center; P.J. Wright, Oxford Instruments, "Spatial distribution of the luminescence in GaN thin films," App. Phys. Lett. 68 (1), Jan. 1, 1996, pp. 57–59.

Shuji Nakamura, Masayuki Senoh, Shin–ichi Nagahama, Naruhito Iwasa, Takao Yamada, Toshio Matsushita, Hiroyuki Kiyoku and Yasunobu Sugimoto, "InGaN–Based Muli–Quantum–Well–Structure Laser Diodes," Jpn. J. Appl. Phys. vol. 35 (1996) pp. L74–L76.

Isamu Akasaki, Hiroshi Amano, Shigetoshi Sota, Hiromitsu Sakai, Toshiyuki Tanaka and Masayoshi Koike, "Stimulated Emission by Current Injection from an AlGaN/GaN/GaInN Quantum Well Device," Jpn. J. Appl. Phys. vol. 34 (1995) pp. L1517–L1519.

Shuji Nakamura, Masayuki Senoh, Shin–ichi Nagahama, Naruhito Iwasa, Takao Yamada, Toshio Matsushita, Hiroyuki Kiyoku, and Yasunobu Sugimoto, "Characteristics of InGaN multi–quantum–well–structure laser diodes," Appl. Phys. Lett. 68 (23, Jun. 3, 1996, pp. 3269–3271.

Shuji Nakamura, Masayuki Senoh, Shin–ichi Nagahama, Naruhito Iwasa, Takao Yamada, Toshio Matsushita, Hiroyuki Kiyoku and Yasunobu Sugimoto, "InGaN multi–quantum–well structure laser diodes grown on $MgAl_2O_4$ substrates," Appl. Phys. Lett. 68 (15), Apr. 8, 1996, pp. 2105–2107.

Shuji Nakamura, Masayuki Senoh, Shin–ichi Nagahama, Naruhito Iwasa, Takao Yamada, Toshio Matsushita, Hiroyuki Kiyoku and Yasunobu Sugimoto, "InGaN Multi–Quantum–Well–Structure Laser Diodes with Cleaved Mirror Cavity Facets," Jpn. J. Appl. Phys. vol. 35 (1995), pp. L217–L219.

Shota Kitamura, Kazumasa Hiramatsu and Nobuhiko Sawaki, "Fabrication of GaN Hexagonal Pyramids on Dot–Patterned GaN/Sapphire Substrates via Selective Metalorganic Vapor Phase Epitaxy," Jpn. J.A. Appl. Phys. vol. 34 (1995) pp. L–1184—L1186.

*Primary Examiner*—Nathan K. Kelley

[57] ABSTRACT

The present invention relates to electronic devices formed in crystallites of III-V nitride materials. Specifically, the present invention simplifies the processing technology required for the fabrication of high-performance electronic devices in III-V nitride materials.

5 Claims, 14 Drawing Sheets

SEMICONDUCTOR DEVICES CONSTRUCTED FROM CRYSTALLITES

FIELD OF INVENTION

The present invention relates generally to solid state laser devices which emit short-wavelength radiation. More specifically, the invention relates to laser structures constructed from hexagonal crystallites.

BACKGROUND OF INVENTION

Solid state lasers made from Group III-V nitrides such as InAlGaN, have great potential in applications in many areas such as high-resolution full-color printing, high-density optical storage, advanced display systems, and optical communications. Since materials in the Group III-V nitride system have bandgaps that vary from 1.9 eV to 6.2 eV, a laser or light emitting diode ("LED") made from a Group III-V nitride may emit light at a wavelength ranging from 380 to 600 nanometers (nm). A laser made from GaN can emit light in the ultra-violet region of the spectrum whereas a laser made from InN can emit light in the red region. Therefore, the Group III-V nitride material system can produce lasers at wavelengths covering a wide range of the electromagnetic spectrum.

The lasers formed by materials in the Group III-V nitride system which produce emissions at short wavelength such as green or blue have particularly significant implications in high-resolution printing and high-density optical storage. For instance, substantial effort has been expended in developing a blue laser for high-resolution printing because of a blue laser's small fundamental spot size and superior depth of focus. The small spot size allows for higher "dpi" (dots per inch) printing, and therefore improved resolution. The superior depth of focus enables a blue laser to be easily focused, allowing for the use of relatively low cost optics even in a high resolution printing system.

Short-wavelength lasers also allow for high density optical storage of audio information, video information, and data. Conventional compact disc ("CD") players and CD-ROM drives use a infrared laser beam. Currently, a standard 12.7 cm CD can hold up to 650 megabytes of data. Blue lasers, at half the wavelength of red lasers, have much smaller spot sizes and can read and write in finer detail on optical discs, thereby substantially increasing their data capacity. They will allow audio CD's and CD-ROMS to store up to at least five times the information they currently hold.

As stated previously, in addition to producing short-wavelength lasers, the Group III-V nitride material system can produce lasers which emit light at a wavelength ranging from 380 to 600 nanometers (nm). The ability to produce lasers with large wavelength separation with a single material system is important in full-color xerographic printing. Generally, in xerographic printing, a full-color print is formed by superimposing an electrostatic image in black with an electrostatic image in each of the three primary colors (cyan, magenta, and yellow). In one architecture, to achieve high-speed single-pass printing, four laser beams are typically required, one for each color and black. The laser beams simultaneously strike a single raster output polygon mirror and a single set of scan optics. The beams are then separated by optical filters, and each beam is directed to a photoreceptor for printing a color. A similar application is to use red, green, and blue lasers to make full-color film printing for computer generated movies.

In order for the optical filters to effectively isolate each beam at a reasonable cost, the laser beams must typically have a separation of at least 50 nanometers in their wavelengths. To make such a four-laser array on the same substrate, the use of two semiconductor material systems is generally required. For instance, the $Al_xGa_{1-x}As$ material system can produce lasers with wavelengths from approximately 750 nanometers to 850 nanometers whereas the AlGaInP material system can produce lasers from approximately 630 to 700 nanometers. In contrast, a laser array formed using materials in the Group III-V nitride system can achieve large wavelength separations without using a second material system.

Red, green, and blue lasers can also be used to produce brighter and more efficient projection displays. They can also be used for backlighting in direct view displays such as screens for laptop computers. Furthermore, due to the physical and electronic properties of materials in the Group III-V nitride system, devices formed using such materials can withstand higher temperatures, higher power densities, and harsher environmental conditions. Hence, the need for lasers formed using Group III-V nitrides crosses a wide spectrum of applications.

Unfortunately the development of lasers formed by Group III-V nitride materials has been hampered by numerous problems in the processing technology of such materials. For instance, the difficulties in forming high-quality single-crystalline Group III-V nitride materials over large areas are well known. Group III-V materials tend to form dislocations and cracks easily. They are also difficult to remove by etching. Due to the difficulty in etching III-V nitride materials, techniques to selectively deposit nitride materials over a smaller area have been developed. An example of such a selective deposition technique is described in "Fabrication of GaN Hexagonal Pyramids on Dot-Patterned GaN/Sapphire Substrate via Selective Metalorganic Vapor Phase Epitaxy" by Kitamura et al., Jpn. J. App. Phys. vol. 34(1995) pp. L1184–1186 (1995). However, such techniques often result in the formation of hexagonal pyramids, commonly known as "hillocks," which are a manifestation of the natural lattice structure of III-V nitride materials. These hillocks are often viewed as defects unsuitable for use in any application because of their topology and crystalline structures. However, high-quality crystallites with a topology suitable for device fabrication have been described in recent publications such as in "Spatial Distribution of the Luminescence in GaN Thin Films," by Ponce et al., Appl. Phys. Lett. 68(1), pp. 57–59 (1996).

BRIEF SUMMARY OF INVENTION

The present invention takes advantage of crystallites which are associated with natural lattice structures of III-V nitrides to form semiconductor devices. Each III-V nitride material has a natural lattice structure, and these crystallites are manifestations of natural lattice structures of the III-V nitride materials. The use of these crystallites alleviates the need to form single-crystalline nitride material over large areas since their sizes typically range from tens of microns to millimeters. These crystallites also have large flat surfaces, making device formation in them possible. Additionally, these crystallites have superior structural, optical, and electronic properties, allowing for the formation of high-performance semiconductor devices. For instance, it would allow for the manufacture of laser devices with high-efficiency and low threshold current. The present invention also simplifies the processing required to form an electronic device comprising of a patterned element such as a bipolar transistor or a field effect transistors in the III-V nitride material system. It also allows for the integration of electronic devices with optoelectronic devices.

One advantage of the present invention is that it greatly simplifies the processing required in the fabrication of short-wavelength lasers in the blue and green portion of the spectrum, which have wide applications in high-resolution printing and high-density optical storage systems. The present invention alleviates the need to grow high-quality planar epitaxial films over a large area.

A further advantage of the present invention is that it makes possible the formation of an array of electronic or optoelectronic devices on a single substrate. For instance, under the present invention, a substrate may be patterned so that a two-dimensional array of laser devices may be formed. Such two-dimensional arrays would allow for multiple-beam printing and help enable the manufacture of super high-speed printing devices.

The advantages and objects of the present invention will become apparent to those skilled in the art from the following detailed description of the invention, its preferred embodiments, the accompanying drawings, and the appended claims.

DETAILED DESCRIPTION OF PREFERRED EMBODIMENTS

Figure 1:
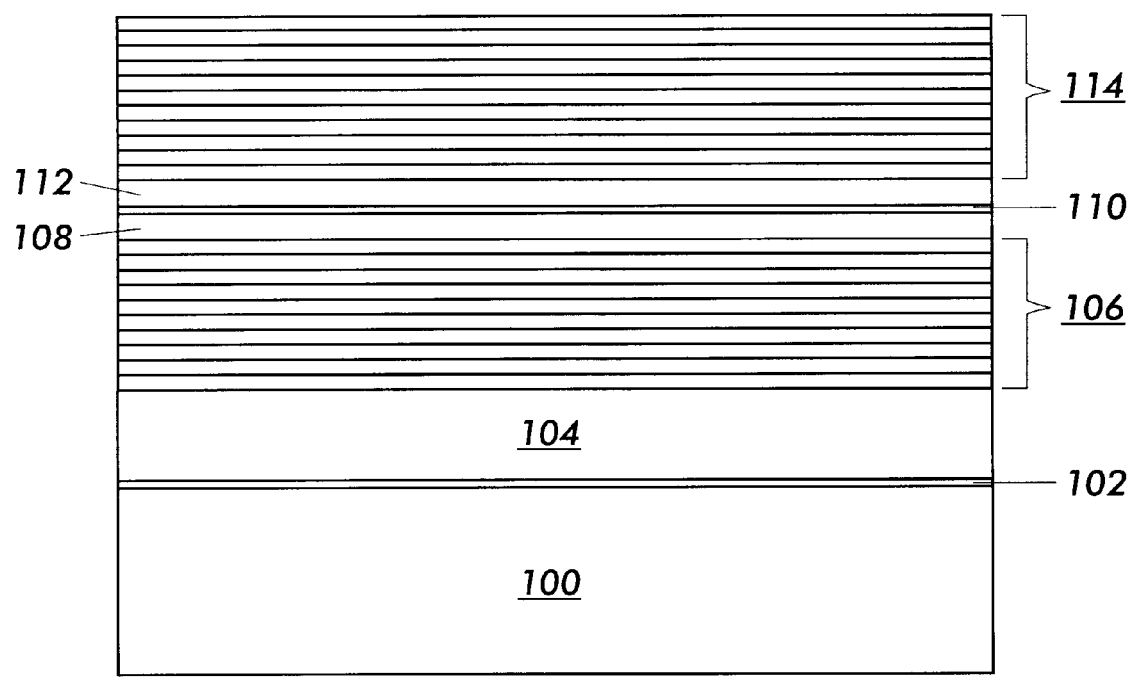
FIG. 1 illustrates a cross-sectional view of a hexagonal crystallite structure with a plurality of semiconductor layers on a sapphire substrate. The hexagonal crystallite structure shown may be used to implement the preferred embodiment of the present invention.

FIG. 1 illustrates the layers of a hexagonal crystallite structure which is used to implement the preferred embodiment of the present invention. Under this embodiment, this structure is used to form a vertical cavity surface emitting laser ("VCSEL") in a single hexagonal crystallite. The laser structure uses a "C"-plane sapphire ($Al_2O_3$) substrate 100 with good surface quality. Other substrates known to those of ordinary skill in the art, such as "A"-plane sapphire, silicon carbide or spinel substrate ($MgAl_2O_4$) may also be used. Prior to any epitaxial process, the sample undergoes a nitridation process, during which it is exposed to ammonia gas at above 1000° C. momentarily. The duration of the exposure may not be critical in most circumstances. The duration of the exposure to ammonia gas may range from seconds to minutes. Typically, the sample is exposed to ammonia for about five to ten minutes. This nitridation process replaces the oxygen atoms on the surface of the substrate with nitrogen atoms, converting the aluminum oxide on the surface to aluminum nitride. Instead of ammonia, other nitrogen precursors which are sufficiently pyrolyzed above 500° C. such as hydrazine, phenylhydrazine, or other organic nitrogen molecules may also be used.

After the nitridation process, nitride layers are deposited on the sapphire substrate 100 by an epitaxial process known as metal-organic chemical vapor deposition ("MOCVD") at approximately 500 to 1100° C. Hydride vapor phase epitaxy ("VPE"), liquid phase epitaxy ("LPE"), molecular beam epitaxy ("MBE"), and other known crystal growth processes may also be used. As shown in FIG. 1, a thin amorphous GaN layer 102 is first deposited on the substrate 100. Other nitride materials such as AlN may also be used. This GaN layer 102 is typically deposited at a low temperature such as 550° C. to ensure that the resulting film will be amorphous. This amorphous film 102 should provide a good continuous coverage of the substrate, on which other epitaxial layers are formed. After the deposition process, the amorphous layer 102 is then heated up so that it undergoes a solid phase epitaxy process during which the film becomes crystalline. The thickness of the amorphous layer 102 must ordinarily be such that it will crystallize in a manner which is well-aligned to the atoms of the substrate material 100. If the GaN layer 102 is too thin, the material may not completely cover the substrate 100. If the GaN layer 102 is too thick, the film may crystallize through two different processes—"homogeneous crystallization" and "solid phase epitaxy." Homogeneous crystallization is the process by which the amorphous GaN film 102 crystallizes in accordance with the natural lattice structure of GaN. In contrast, solid phase epitaxy is the process by which the GaN film 102 crystallizes in accordance to the underlying substrate 100. As a result, the crystallization process would produce randomly aligned crystallites embedded in the layer. Typically, the thickness of the GaN layer 102 ranges from 10 to 40 nanometers (nm).

Additionally, this amorphous GaN layer 102 serves to release the stress between the interface of the layers above the substrate 100 and the substrate 100. This amorphous GaN layer 102 helps to accomodate the lattice mismatch that exists between the substrate and the epitaxial films. It also acts as a nucleation layer for the subsequently deposited epitaxial layers.

Above the amorphous GaN layer 102, a thicker GaN layer 104 of three to five microns ($\mu$m) is deposited. This layer is generally deposited at 1000–1100° C., producing a crystalline film. Under this embodiment, instead of a planar epitaxial film, the deposited layer tends to crystallize into hexagonal structures with flat top surfaces over the substrate. These crystallites on the substrate may be associated with the lattice structure of one of the deposited layers. The size of these hexagonal crystallites varies from microns to millimeters. Generally, thicker epitaxial layers tend to produce larger hexagonal crystallites and films of higher structural quality. A discussion of the quality of such films may be found in "Spatial Distribution of the Luminescence in GaN Thin Films," by Ponce et al., Appl. Phys. Lett. 68(1), pp. 57–59 (1996). However, as this GaN layer 104 becomes thicker, the throughput of the process may be of concern.

The doping of the GaN buffer layer 104 is generally silicon at a level of approximately $5 \times 10^{18} cm^{-3}$. Other n-type dopants such as selenium (Se), tellurium (Te), tin (Sn) or sulphur (S) may also be used. Under this embodiment, an even higher doping level in the GaN layer 104 is desired because the n-type contact to the laser structure would be formed on this layer. Higher doping generally produces lower contact resistance. However, it is well known that GaN films, which are highly-doped by silicon, are susceptible to "alloy hardening" effects which typically cause cracks in the epitaxial film. Dislocations and cracks in the GaN buffer layer 104 is a particularly serious problem in light of the relatively large lattice mismatch between an $Al_2O_3$ substrate and a GaN film.

Above the GaN buffer layer 104 is a superlattice structure for forming a lower distributed Bragg reflector ("DBR") 106 which provides the necessary internal reflection and outcoupling of light in a VCSEL structure. The lower DBR 106 is typically formed by multiple pairs of an AlGaN layer and a GaN layer, both of which are n-type. The number of pairs required depends upon the desired reflectivity. Typically, 20 to 50 pairs are used. To achieve high internal reflection, the reflectivity should be as close to 100% as possible. High reflectivity generally reduces the threshold current of a laser. However, if the DBR structure is also used to outcouple light, its reflectivity must be slightly below 100 percent. In this case, the reflectivity of the lower DBR 106 is typically 98% to 99% because it is used to outcouple the light.

The reflectivity of the lower DBR 106 is a function of the difference in the refractive index between the AlGaN layer and the GaN layer of the superlattice. The greater the difference in their refractive indices, the fewer number of pairs are required. Under this embodiment, the refractive index of the AlGaN layer in the DBR superlattice 106 is approximately 2.2 to 2.3, which corresponds to an aluminum content of approximately 20% to 40%. Presently, the correlation between aluminum mole fractions and the corresponding refractive indices is not yet well established. Factors other than reflectivity such as strain, current injection requirements, and the offset between the conduction band and the valence band also influence the aluminum content to be used in the AlGaN layers of the superlattice 106. Generally, more strain in the film is created when higher aluminum content is used in the AlGaN layers of the DBR superlattice 106. Interface problems as well as difficulties in doping tend to occur as higher aluminum content in the AlGaN layers of the superlattice 106 is used.

The thickness of the individual AlGaN or GaN layers of the DBR superlattice 106 depends upon the desired output wavelength of the laser as well as the refractive index of the material forming the active region of the laser structure. Typically, the thickness is one quarter of the output wavelength divided by the refractive index of the material. For instance, if the laser is designed to produce emission at 420 nm, the thickness of each layer should be 105 nanometers divided by the refractive index of the material which is about 2.5 for GaN, amounting to approximately 40 nanometers.

Immediately above the lower DBR structure is an InGaN or GaN layer 108. The lower InGaN or GaN layer 108, the active layer 110, and the top InGaN or GaN layer 112 comprise the optical cavity or the so-called "spacer" between the two DBR's 106 and 114. The total thickness of these three layers, 108, 110, and 112, is an integer multiple of the desired output wavelength. This integer multiple is typically in the range of one to ten. For instance, assuming that the integer multiple is one, the weighted average refractive index is 2.5, and the desired output wavelength is 420 nm, the total thickness of all three layers, 108, 110, and 112, should then be 168 nanometers. Above this InGaN layer 108 is the active layer 110 of the laser structure which is formed by a single InGaN quantum well or a multiple quantum well structure ("MQW"). A typical thickness of a quantum well structure is one to five nanometers. To achieve an output wavelength of 420 nanometers, the indium mole fraction is typically 15% to 20%. Nothing in this invention prevents the use of a thicker GaN or InGaN layer as the active layer 110. The thickness of such a GaN or InGaN layer would be approximately one to ten nanometers.

Above the active layer 110 is an upper InGaN or GaN layer 112 whose thickness is essentially the same as the lower InGaN layer 108. These two InGaN layers, 108 and 112, along with the active layer 110 form the optical cavity in which the desired optical gain can be attained. Above the upper InGaN layer 112 is an upper DBR structure 114, which is structurally similar to the lower DBR structure 106. Since the lower DBR 106 is n-type, this upper DBR 108 is p-type. Instead of a p-type DBR, a material such as titanium dioxide ($TiO_2$)or aluminum dioxide ($Al_2O_3$), which is transparent to light at 420 nanometers, may also be used. The use of such an insulating DBR material would necessitate an alternative approach in forming the p-type contacts. A metal may also be used to reflect the light so long as the metal does not absorb light at the wavelength produced by the laser.

Figure 2A:
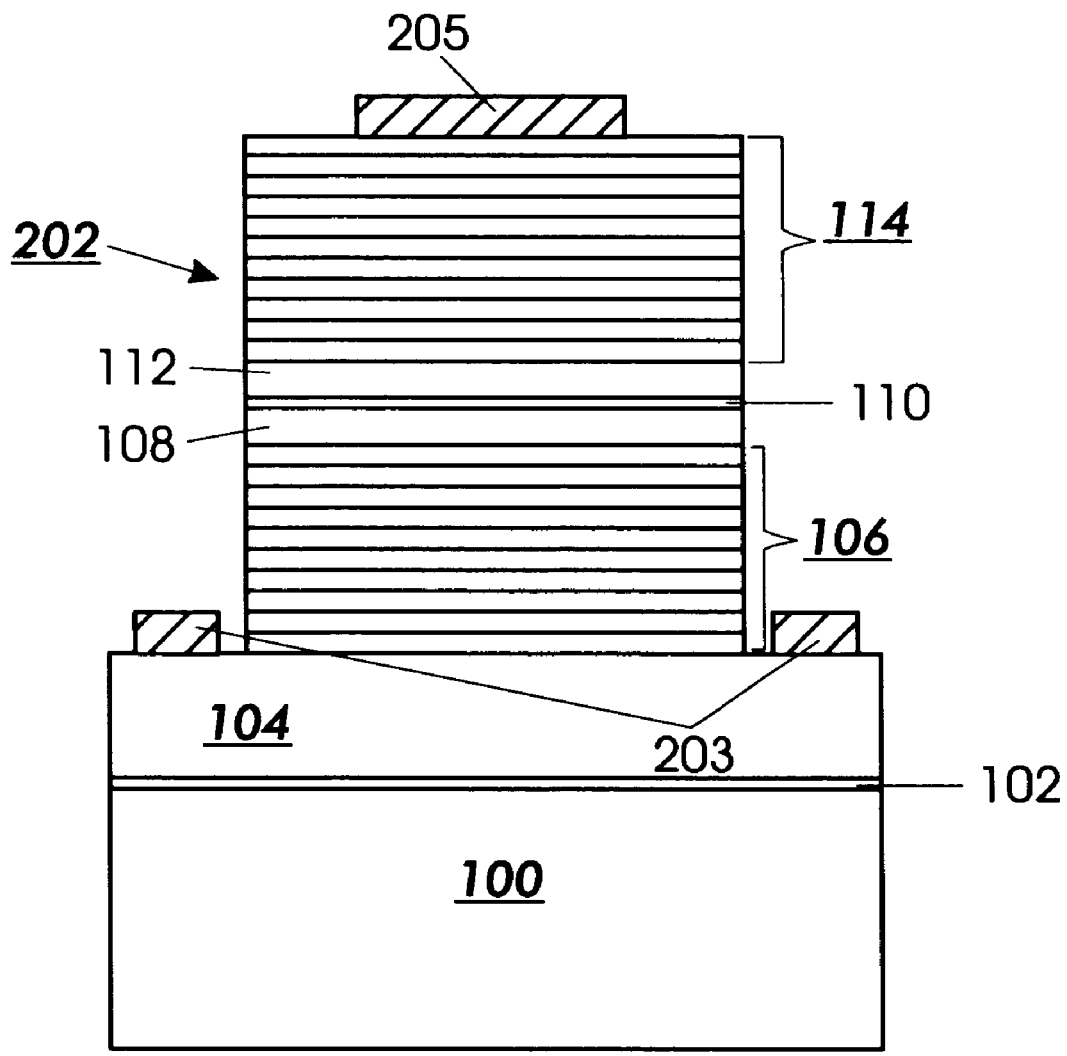
FIG. 2(a) illustrates a cross-sectional view of a vertical cavity surface emitting laser structure formed in a hexagonal crystallite structure with a plurality of semiconductor layers.
Figure 2B:
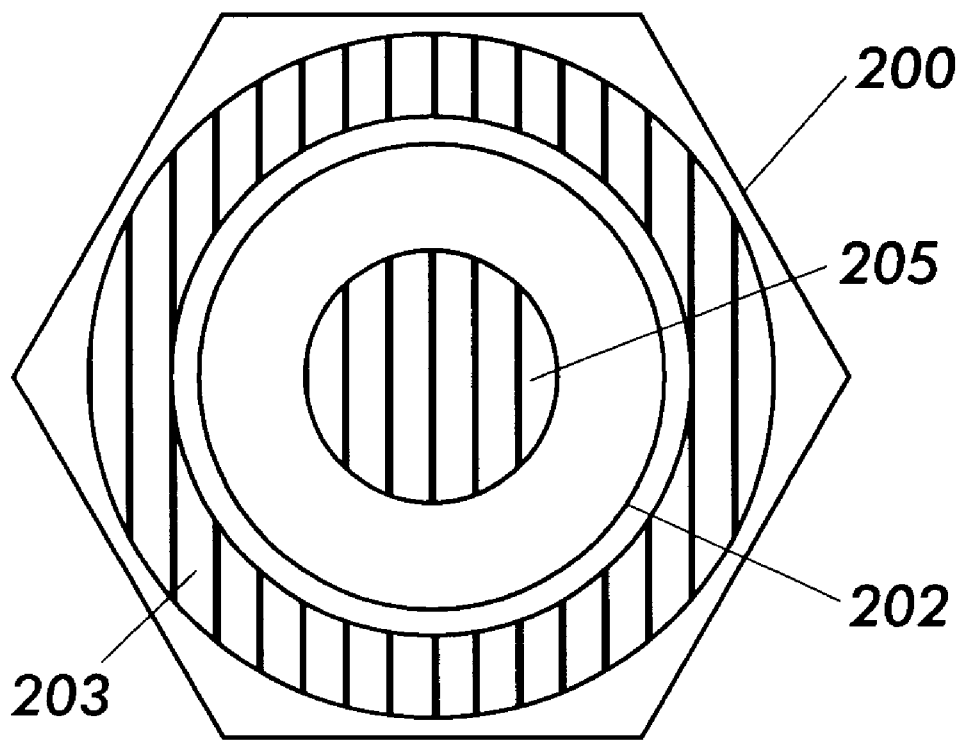
FIG. 2(b) illustrates a top view of a vertical cavity surface emitting laser structure formed in a hexagonal crystallite structure with a plurality of semiconductor layers.

FIGS. 2 (a) and (b) illustrate a cross-sectional view and a top view of the preferred embodiment respectively. FIG. 2(a) shows a cross-sectional view of a VCSEL formed in a hexagonal crystallite structure 200 with a plurality of semiconductor layers as shown in FIG. 1. FIG. 2(b) shows a top view of a VCSEL formed in a hexagonal crystallite. After the epitaxial layers 104 though 114 shown in FIG. 1 have been formed, the sample undergoes an etching step to produce the cylindrical mesa structure 202 shown in FIG. 2. The depth of the mesa structure should be such that an n-type contact 203 to the VCSEL can be formed on the n-type GaN layer 104 as shown in FIG. 2(b). The n-type contact 203 is in a donut shape as shown in FIG. 2(b). After the n-type contact 203 has been formed, the sample is masked so that a circular p-contact 205 can be formed above the upper DBR structure 114. As shown in FIG. 2(b), the entire laser structure is formed in a single hexagonal crystallite 200, portions of which have been removed by etching during the formation of the VCSEL.

Figure 3A:
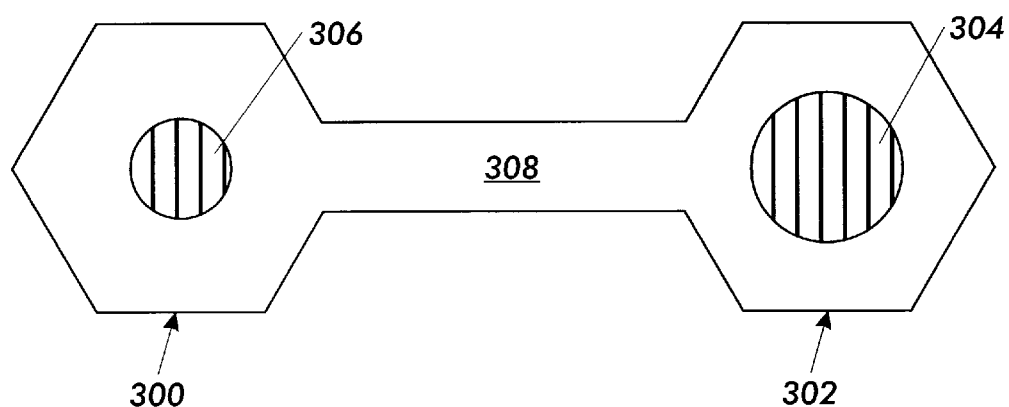
FIG. 3(a) illustrates a top view of two adjacent hexagonal crystallites which are used to form a laser structure. The crystallites are connected by a bridge structure.

The semiconductor structure shown in FIG. 1 may also be used to implement a second embodiment of the present invention. Under this alternative embodiment, two adjacent hexagonal crystallites, 300 and 302, are used to form a single laser structure as shown in FIG. 3(a). FIG. 3 shows a top view of two hexagonal crystallites 300 and 302 which are connected by a bridge 308. To form such as structure, a silicon dioxide layer is first deposited on the substrate material. Then, a pair of pin-holes a fixed distance apart is formed in the silicon dioxide layer using a mask. As previously stated, prior to the epitaxial process, the substrate first undergoes a nitridation process. The pin-holes in the substrate, along with the nitridation process, help the nucleation of hexagonal crystallite structures at the locations of the pin-holes.

Figure 3B:
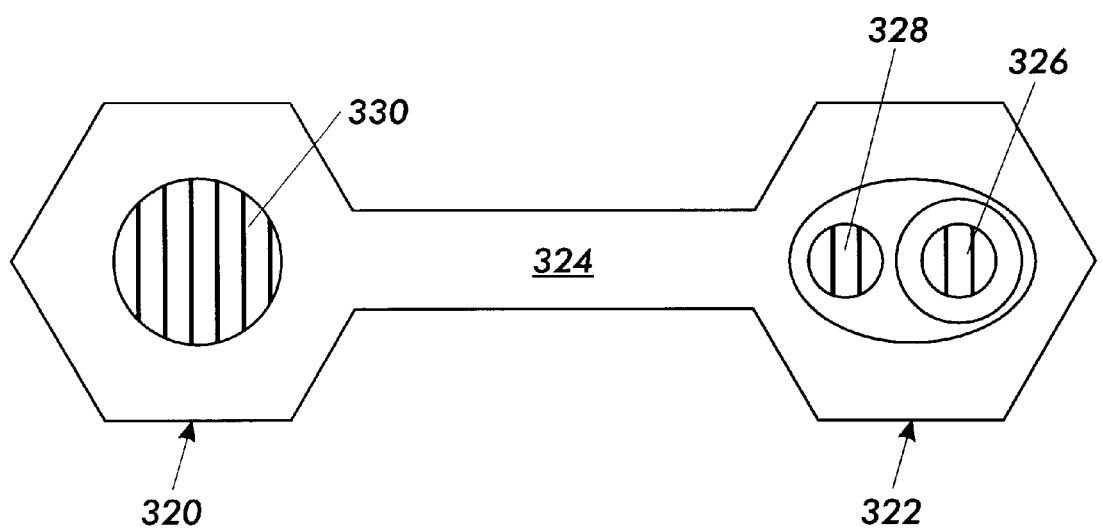
FIG. 3(b) illustrates a top view of two adjacent hexagonal crystallites which are used to form a transistor. The crystallites are connected by a bridge structure.

Under this embodiment, one of the hexagonal crystallite 300 is for forming a VCSEL structure and its p-type contact 306. The other hexagonal crystallite structure 302 is for forming the n-type contact 304 of the VCSEL. Such an approach is particularly useful if there is difficulty in achieving large crystallite structure. The bridge 308 is formed by removing the epitaxial materials surrounding the hexagonal crystallite structures 300 and 302 as well as the bridge region 308. Likewise, a bipolar transistor can be formed in two adjacent hexagonal crystallites, 320 and 322, as shown in FIG. 3(b). The two crystallites 320 and 322 are connected by a bridge structure 324. Under this approach, the emitter contact 326 and the base contact 328 are formed in one of the crystallites 322. The collector contact 330 is formed in another crystallite 320.

Figure 4:
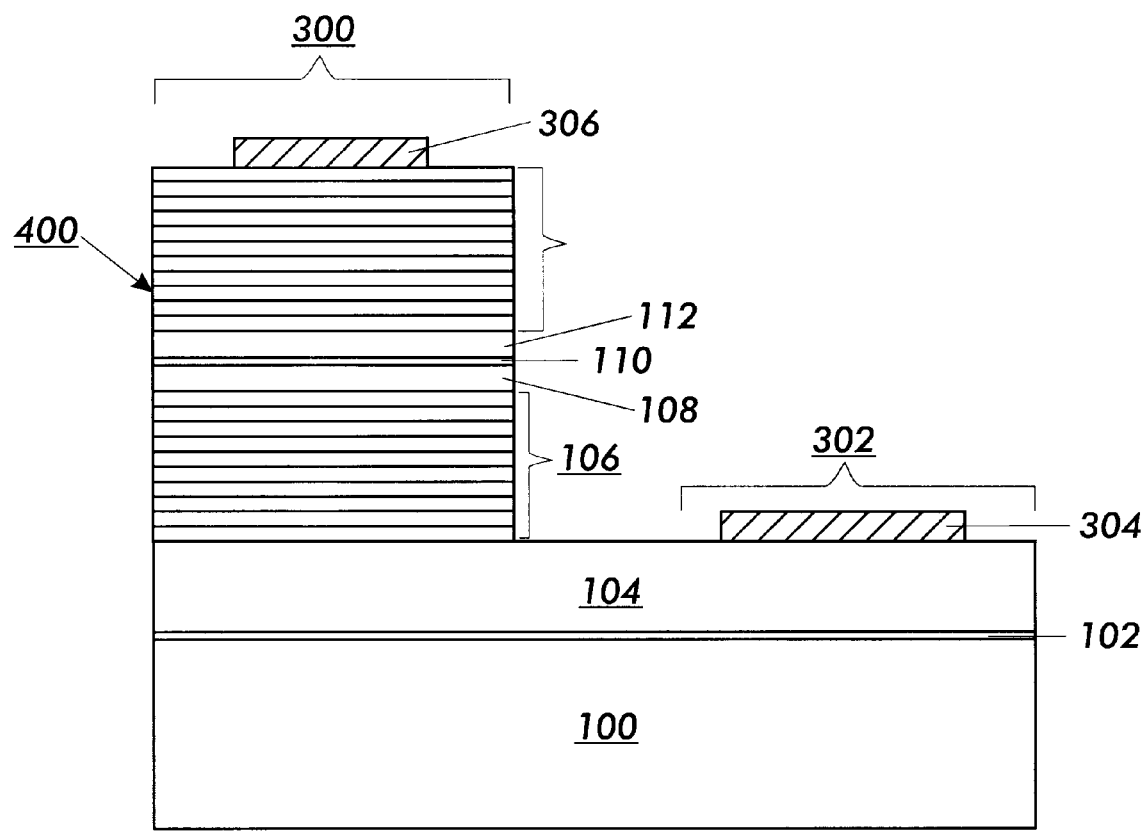
FIG. 4 illustrates a cross-sectional view of a vertical cavity surface emitting laser structure formed in two separate hexagonal crystallites connected by a bridge.

FIG. 4 shows a cross-sectional view of a VCSEL formed in two hexagonal crystallite structures. As shown in FIG. 4, the epitaxial layers are etched so that a p-type contact 306 can be formed. The depth of the mesa structure 400 should be such that an n-type contact 304 can be formed on the n-type GaN layer 104. Above the mesa structure 400, a p-type contact 306 is formed.

Figure 5A:
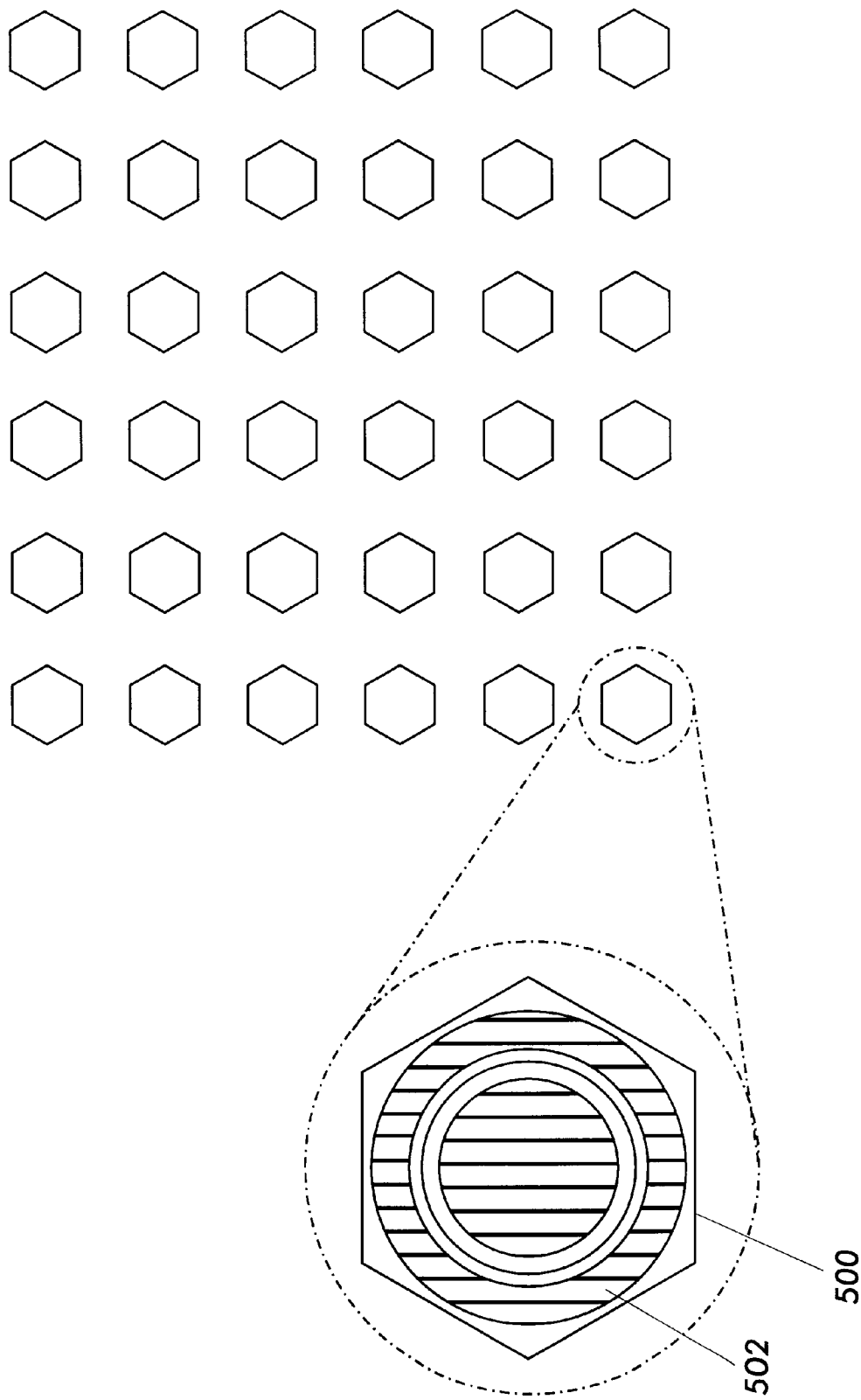
FIG. 5(a) illustrates a top view of a two-dimensional array of hexagonal crystallites formed in accordance to a pattern in the substrate. As illustrated, a laser device may be formed in each crystallite.
Figure 5B:
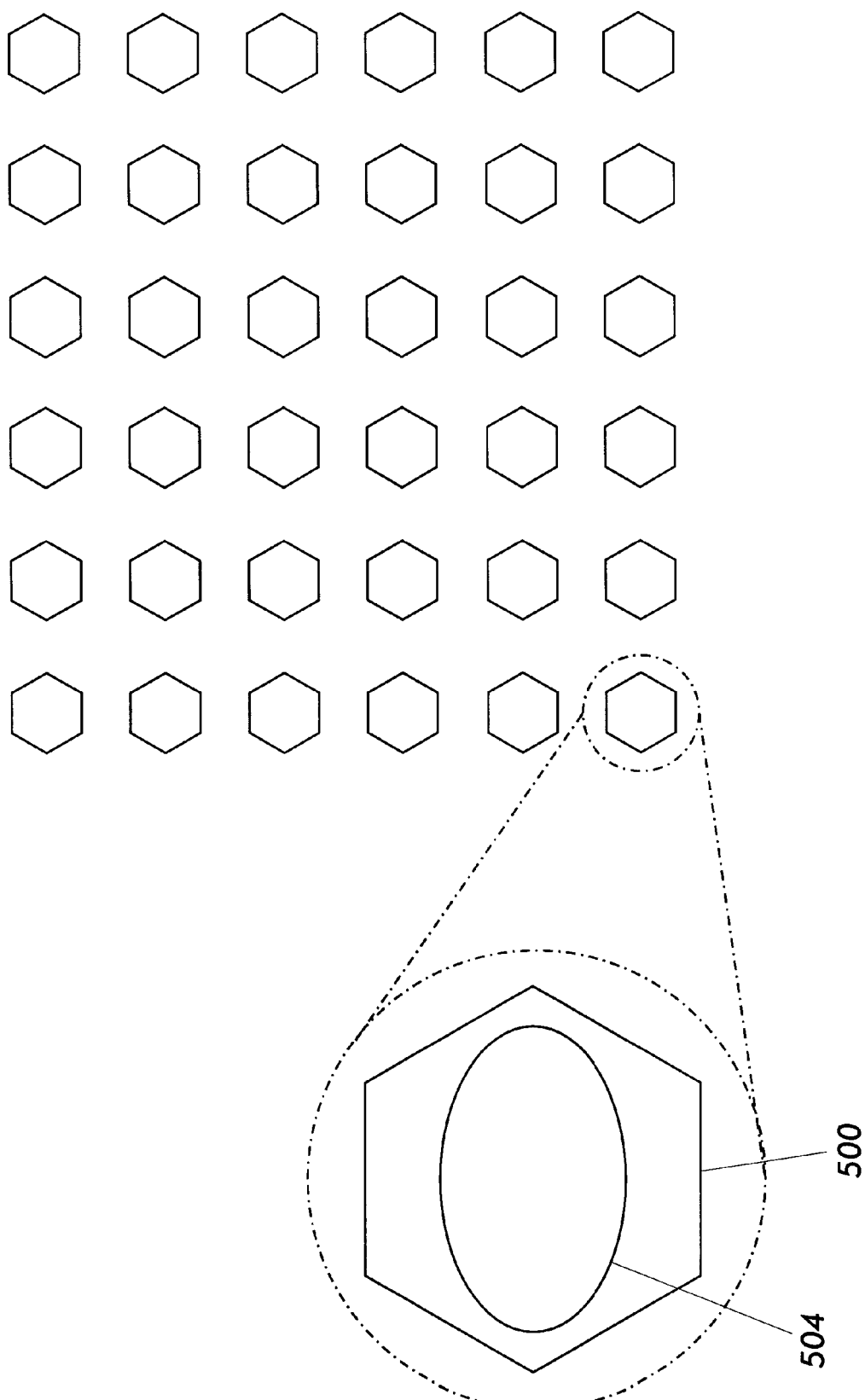
FIG. 5(b) illustrates a top view of a two-dimensional array of hexagonal crystallites formed in accordance to a pattern in the substrate. As illustrated, a transistor may be formed in each crystallite.

The embodiment shown in FIG. 2(b) is easily extendible to the formation of a two-dimensional array of hexagonal crystallites as shown in FIG. 5(a) through the formation of an array of pin-holes in the substrate. The pin-holes are generally formed by a silicon dioxide mask defined by photolithography. FIG. 5(a) shows a 6×6 crystallite array which can be used to form a two-dimensional array of devices. For instance, as shown in FIG. 5(a), a laser structure 502 may be formed in each of the hexagonal crystallites 500. Likewise, as shown in FIG. 5(b), other semiconductor device comprises a patterned element such as a transistor structure may be formed in each of the hexagonal crystallites 500. FIG. 5(b) is intended to show a generic transistor, without any of its structural element, formed in a crystallite.

Figure 6:
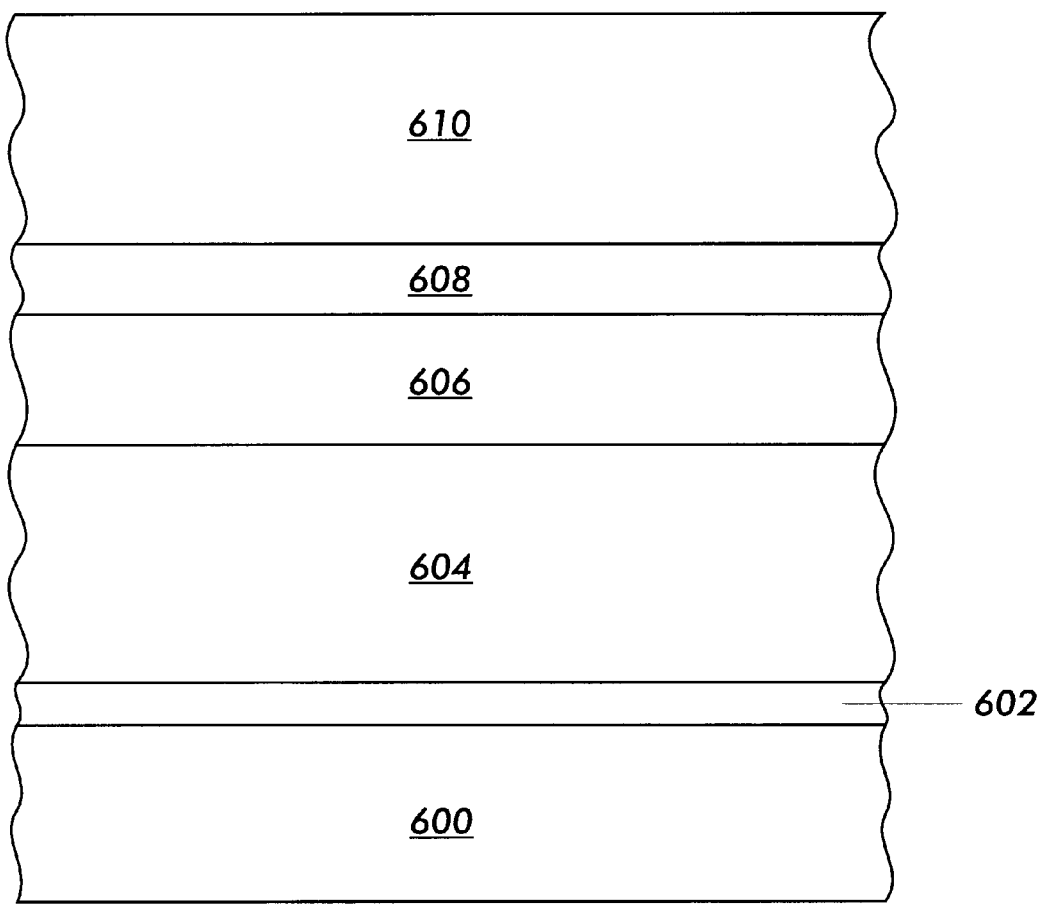
FIG. 6 illustrates a cross-sectional view of a hexagonal crystallite structure with a plurality of semiconductor layers on a sapphire substrate. This hexagonal crystallite structure may be used for forming an edge emitting laser.

FIG. 6 illustrates a semiconductor structure which may be used to implement another embodiment of the present invention. It illustrates the layers of a hexagonal crystallite which may be used to form an edge emitting laser structure. As shown in FIG. 6, the substrate is a "C"-plane sapphire ($Al_2O_3$) substrate 600 with good surface quality. As previously discussed, prior to any epitaxial process, the sample first undergoes a nitridation process, during which it is exposed to ammonia gas at above 1000° C. momentarily. After the nitridation process, nitride layers for forming an edge emitting laser structure are deposited by an epitaxial process known as metal-organic chemical vapor deposition (MOCVD) at approximately 700 to 1100° C. A thin amorphous GaN layer 602 is first deposited on the substrate 600 at a low temperature such as 550° C. Other nitride materials such as AlN may also be used. A typical thickness of the amorphous GaN layer 602 is approximately 10 to 40 nanometers (nm).

Again, after the deposition process, the amorphous GaN layer 602 is then heated up so that it undergoes a solid phase epitaxy process during which the film becomes crystalline. Then, a thick GaN buffer layer 604 of three to five microns ($\mu m$) is deposited. This layer 604 is generally deposited at 1000–1100° C., producing a film which crystallizes into localized hexagonal structures with flat top surfaces. The quality and size of the hexagonal crystallite depends upon the thickness of the layer 604 and other subsequently deposited films. The doping of the GaN buffer layer 604 is silicon at a level of approximately $5\times10^{18}cm^{-3}$. Under this embodiment, an even higher doping level is desired in the GaN buffer layer 604 is desired because the n-type contact to the laser structure would be formed on this layer. However, as stated previously, higher doping generally produces "alloy hardening" effects which may cause cracks in the epitaxial film.

Above the GaN buffer layer 604 is an n-type AlGaN cladding layer 606. The thickness of the layer is typically several hundred nanometers. The aluminum mole fraction ranges from 5 to 15 percent. A aluminum mole fraction of less than 5 percent may also be used. Above the lower AlGaN cladding layer 606 is the active layer 608 formed by a single InGaN quantum well or a multiple quantum well structure. The indium mole is approximately 15 to 40 percent, which should produce emissions at a wavelength of 380 to 450 nanometers. Above the active layer 608 is an upper AlGaN cladding layer 610. This layer is p-type with an aluminum mole fraction which ranges from 5 to 15 percent.

Figure 7A:
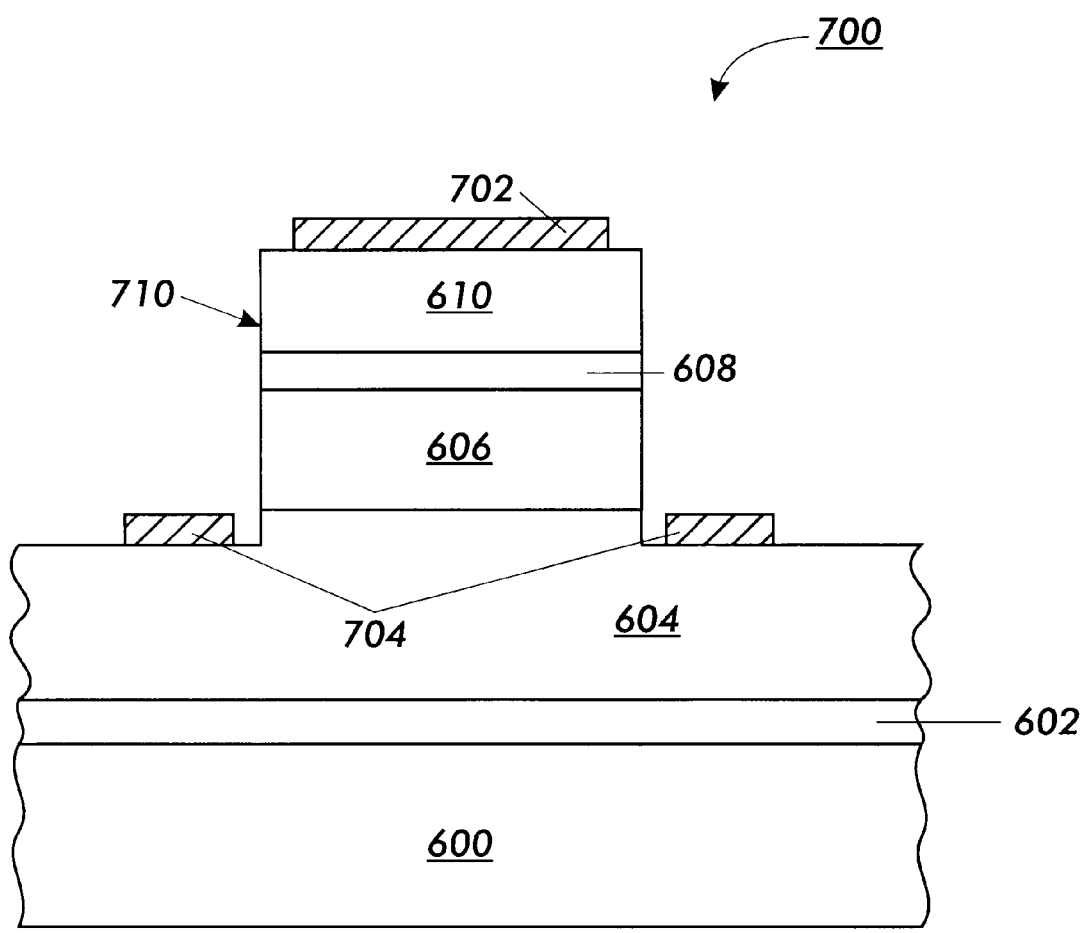
FIG. 7(a) illustrates a cross-sectional view of an edge emitting laser formed in a hexagonal crystallite structure.
Figure 7B:
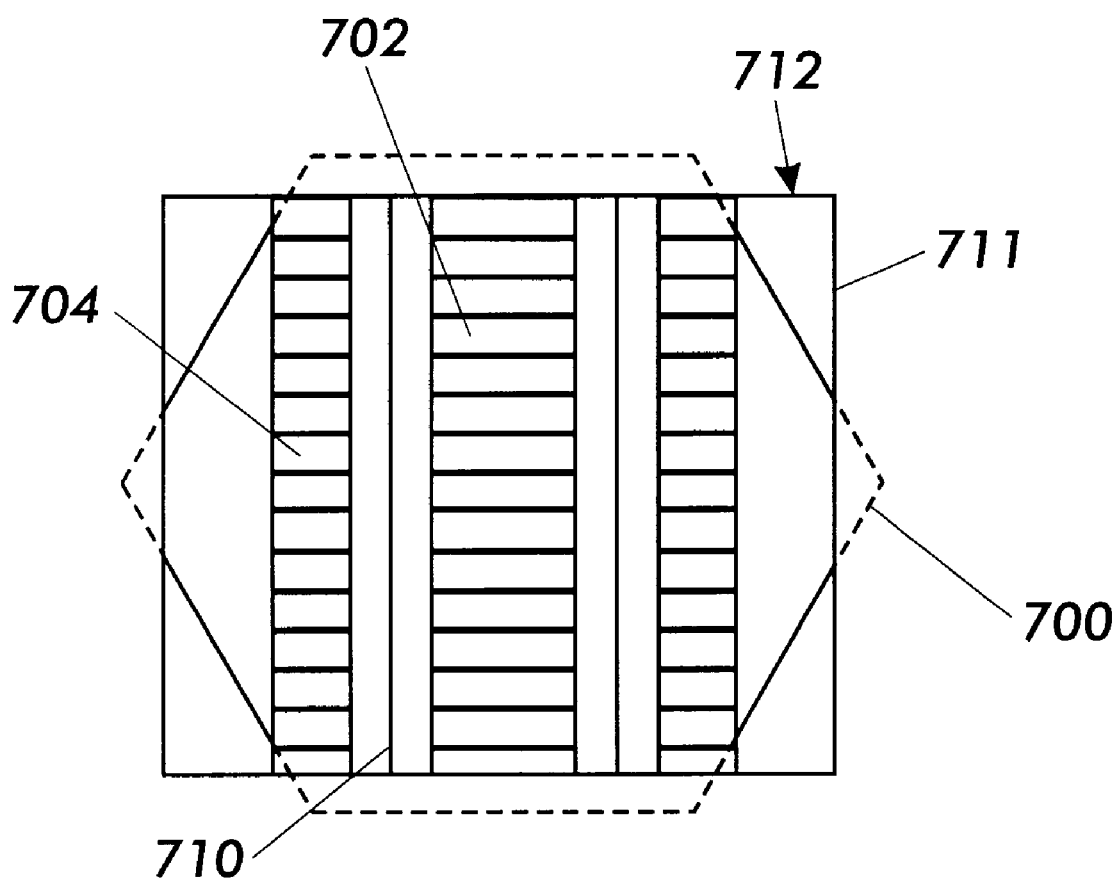
FIG. 7(b) illustrates a top view of an edge emitting laser formed in a hexagonal crystallite structure.

After the formation of the layers shown in FIG. 6, a ridge mesa 710 is formed by an etching process as shown in FIG. 7(a). The depth of the mesa structure 710 should reach the n-type GaN layer 604 so that the n-type contact 704 to the laser structure may be formed. The n-type contact may be formed by using a titanium/gold alloy. FIG. 7(a) shows a cross-sectional view of an edge emitting laser under the present invention. FIG. 7(b) shows a top view of an edge emitting laser under the present invention. After the ridge mesa 710 is etched, a rectangular n-type contact 704 is formed on the GaN layer 604. Similarly, a p-type contact 702 is formed on the p-type AlGaN layer 610. The p-contact 702 is typically formed with a metal such as a nickel/gold alloy. The rectangle in FIG. 7(b) shows the laser chip. The dotted line in FIG. 7(b) shows the hexagonal crystallite structure 700. Before forming the facets 712, the laser structure is etched or mechanically cut to form the edges 711. Then, the laser structure is cleaved or etched along crystalline planes to form side facets 712. In order to form side facets 712 for this laser structure, the size of the hexagonal crystallite 700 should be relatively large so that the side facets 712 may be formed by a cleaving or etching process.

Figure 8:
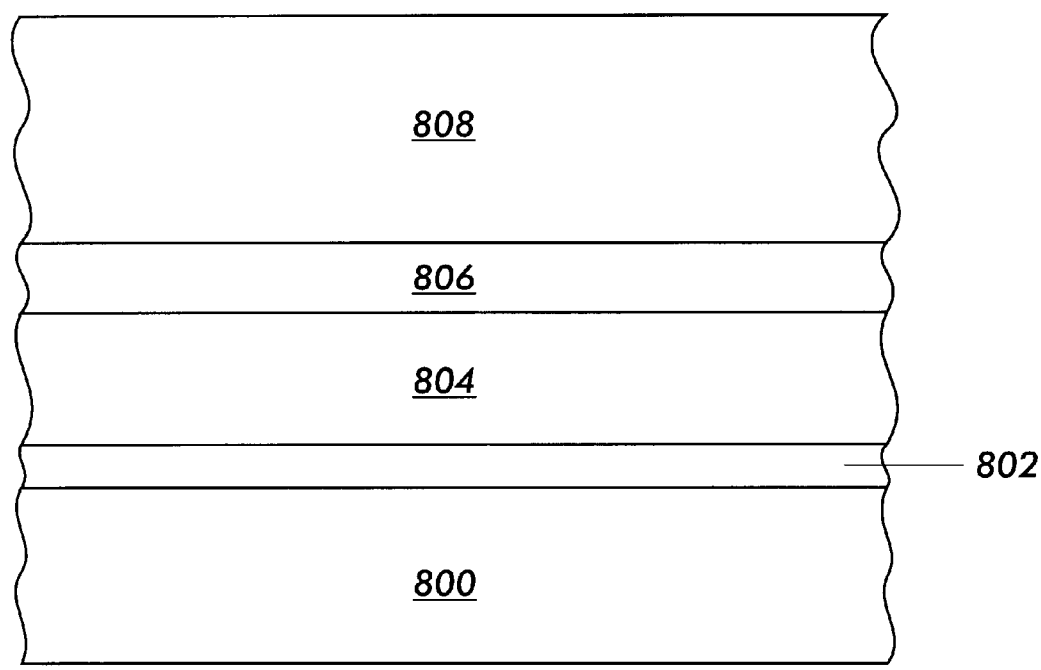
FIG. 8 illustrates a cross-sectional view of a hexagonal crystallite structure with a plurality of semiconductor layers on a sapphire substrate. The hexagonal crystallite structure shown may be used for forming a heterojunction bipolar transistor.

FIG. 8 illustrates a semiconductor structure which may be used to implement another embodiment of the present invention. It illustrates layers of a hexagonal crystallite for forming a heterojunction bipolar transistor. The substrate used is again a "C"-plane sapphire ($Al_2O_3$) substrate 800. After a nitridation process as described previously, epitaxial layers are then deposited by a process known as MOCVD at approximately 500 to 1100° C. As shown in FIG. 8, a thin amorphous GaN layer 802 of approximately 10 to 40 nanometers is first deposited on the substrate 800 at a low temperature such as 550° C. Other nitride materials such as AlN may also be used. Then, the amorphous layer 802 is subsequently heated up so that it undergoes a solid phase epitaxy process during which the film becomes crystalline. Above the amorphous GaN layer 802, a thicker GaN collector layer 804 of three to five microns ($\mu m$) is then deposited. This GaN collector layer 804 is generally deposited at 1000–1100° C., producing a film which crystallizes into hexagonal crystallite structures with flat top surfaces.

The quality and size of the hexagonal crystallites depends upon the thickness of the GaN collector layer 804 as well as the thickness of other subsequently deposited films. Generally, thicker epitaxial layers produce a film of higher quality.

The doping of the GaN collector layer 804 is generally silicon at a level of approximately $5 \times 10^{18} \text{cm}^{-3}$. Its thickness is typically three to five microns. Above the GaN collector layer 804 is a p-type GaN base layer 806 for forming the base of a heterojunction bipolar transistor. The doping and thickness of the p-type GaN layer is typically 50 to 500 nanometers and 1 to $2 \times 10^{18} \text{ cm}^{-3}$. The base layer 806 should generally be as thin as possible to reduce the base transit time of the bipolar transistor. Above the p-type GaN base layer 806 is an n-type AlGaN emitter layer 808 for forming the emitter of the bipolar transistor. The aluminum mole fraction of the n-type emitter layer 808 typically ranges from 0 to 20 percent. Its doping and thickness are typically 0.5 to $5 \times 10^{18} \text{ cm}^{-3}$ and 0.1 to 2 microns respectively.

Figure 9A:
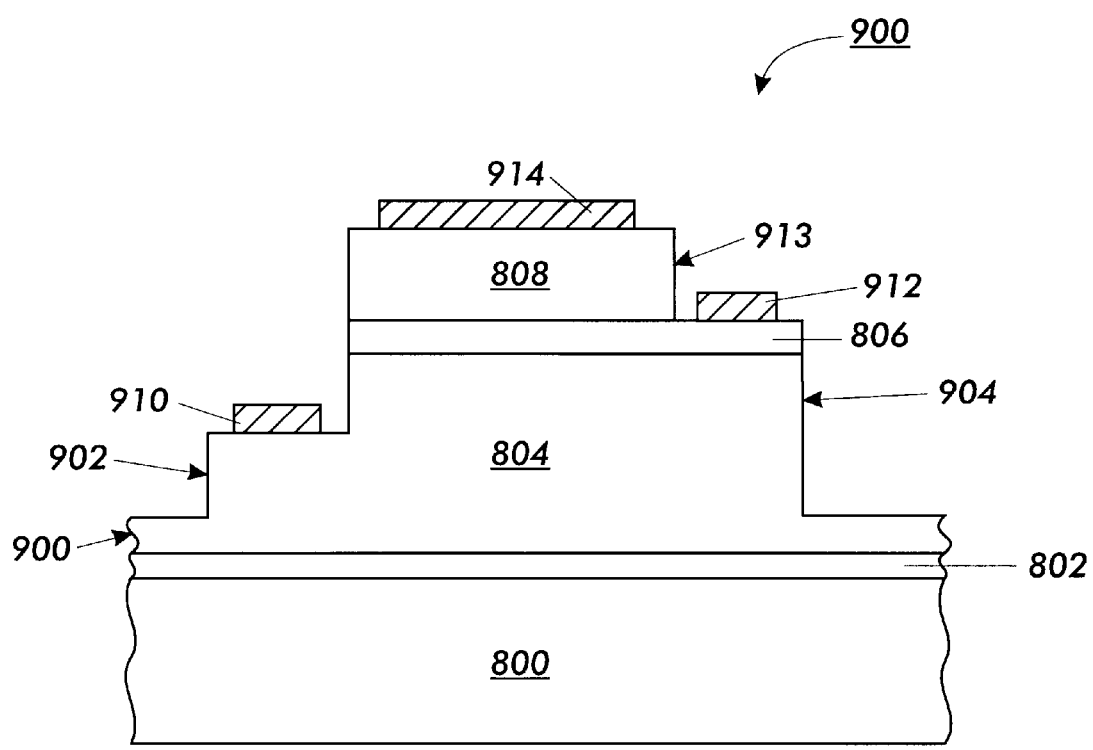
FIG. 9(a) illustrates a cross-sectional view of a heterojunction bipolar transistor formed in a hexagonal crystallite structure.
Figure 9B:
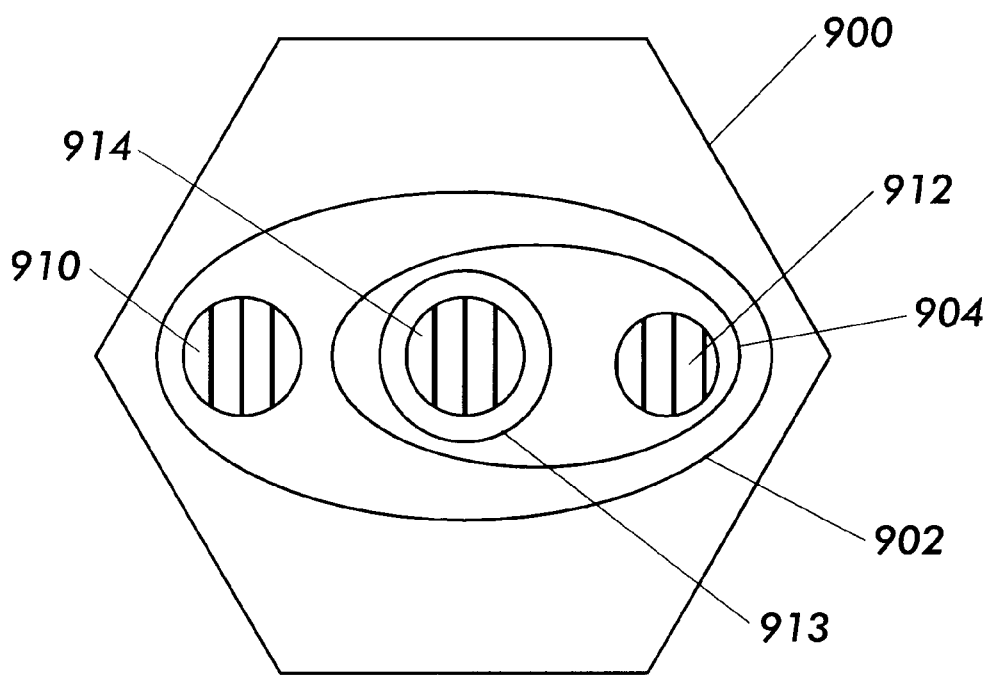
FIG. 9(b) illustrates a top view of a heterojunction bipolar transistor formed in a hexagonal crystallite structure.

FIG. 9(*a*) shows a cross-sectional view of a heterojunction bipolar transistor under the present invention. FIG. 9(*b*) shows a top-view of a heterojunction bipolar transistor under the present invention. After the formation of the layers shown in FIG. 8, a cylindrical mesa structure 902 shown in FIG. 9(*b*) is formed by etching. The depth of this mesa structure 902 should reach the GaN collector layer 804 so that the n-type collector contact 910 may be formed on it. Then, a second cylindrical mesa structure 904 is formed so that a p-type base contact 912 may be formed on the GaN base layer 912 as shown in FIG. 9(*a*). Then, a third cylindrical mesa structure 913 is formed so that an n-type emitter contact 914 can be formed on the AlGaN emitter layer 808. The entire heterojunction bipolar structure is formed in a single hexagonal crystallite 900 as shown in FIG. 9(*b*).

The composition, dopants, doping levels, and dimensions given above are exemplary only, and variations in these parameters are permissible. Additionally, other layers in addition to the ones shown in the figures may also be included. Variations in experimental conditions are also permitted. Lastly, instead of GaN and GaAlN, other semiconductor materials or other III–V alloys may also be used.

While the invention has been described in conjunction with specific embodiments, it is evident to those skilled in the art that many alternatives, modifications, and variations will be apparent in light of the foregoing description. Any other semiconductor device comprises a patterned element may also be formed in a crystallite. Accordingly, the invention is intended to embrace all such alternatives, modifications, and variations that fall within the spirit and scope of the appended claims.

What is claimed is:

1. A structure in which may be formed a semiconductor device, the structure comprising:

an aluminum-containing substrate having a nitrided region formed therein with a generally planar upper surface upon which material layers may be formed, said nitrided region having a single crystal structure;

a gallium nitride nucleation region in physical contact with said upper surface; and a localized crystallite structure formed over and in physical contact with said nucleation region such that said localized crystallite structure forms epitaxially with said upper surface of said region, said localized crystallite structure having a substantially planar upper surface generally parallel to said generally planar upper surface of said nitrided region.

2. The structure of claim 1, wherein said nitrided region is a region of single-crystal aluminum nitride formed in said aluminum-containing substrate.

3. The structure of claim 2, wherein said aluminum containing substrate is $Al_2O_3$.

4. A structure in which may be formed a semiconductor device, the structure comprising:

a substrate formed of $Al_2O_3$ and having a region formed therein with a generally planar upper surface upon which material layers may be formed, said region being comprised of aluminum nitride and having a single crystal structure; and a localized crystallite structure formed over and in physical contact with said upper surface of said region such that said localized crystallite structure forms epitaxially with said upper surface of said region, said localized crystallite structure having a substantially planar upper surface generally parallel to said planar upper surface of said region.

5. A structure in which may be formed a semiconductor device, the structure comprising:

a substrate formed of $Al_2O_3$ and having a region formed therein with a generally planar upper surface upon which material layers may be formed, said region comprising aluminum nitride and having a single crystal structure;

a gallium nitride nucleation region in physical contact with said upper surface; and a localized crystallite structure formed over and in physical contact with said nucleation region such that said localized crystallite structure forms epitaxially with said upper surface of said region, said localized crystallite structure having a substantially planar upper surface generally parallel to said generally planar upper surface of said region.

\* \* \* \* \*

UNITED STATES PATENT AND TRADEMARK OFFICE
CERTIFICATE OF CORRECTION

| | | |
|---|---|---|
| PATENT NO. | : 5,977,612 | Page 1 of 1 |
| APPLICATION NO. | : 08/770403 | |
| DATED | : November 2, 1999 | |
| INVENTOR(S) | : David P. Bour et al. | |

It is certified that error appears in the above-identified patent and that said Letters Patent is hereby corrected as shown below:

Column 1, line 3, insert as a new paragraph:

This invention was made with Government support under Agreement No. 70NANB2H1241 awarded by the Department of Commerce and under Agreement No. MDA972-95-3-0008 awarded by ARPA. The Government has certain rights in this invention.

Signed and Sealed this

First Day of August, 2006

JON W. DUDAS
*Director of the United States Patent and Trademark Office*